United States Patent
Clark (10) Patent No.: US 7,807,586 B2
(45) Date of Patent: Oct. 5, 2010

(54) METHOD OF FORMING A STRESSED PASSIVATION FILM USING A NON-IONIZING ELECTROMAGNETIC RADIATION-ASSISTED OXIDATION PROCESS

(75) Inventor: Robert D Clark, Schenectady, NY (US)

(73) Assignee: Tokyo Electron Limited, Tokyo (JP)

(*) Notice: Subject to any disclaimer, the term of this patent is extended or adjusted under 35 U.S.C. 154(b) by 170 days.

(21) Appl. No.: 12/058,570

(22) Filed: Mar. 28, 2008

(65) Prior Publication Data

US 2009/0246973 A1    Oct. 1, 2009

(51) Int. Cl.
*H01L 21/31* (2006.01)
(52) U.S. Cl. .............. 438/792; 438/793; 438/794; 438/795; 438/E21.24
(58) Field of Classification Search ......... 438/758–765, 438/792–795
See application file for complete search history.

(56) References Cited

U.S. PATENT DOCUMENTS

| | | | |
|---|---|---|---|
| 5,514,908 A | 5/1996 | Liao et al. | |
| 5,652,464 A | 7/1997 | Liao et al. | |
| 6,673,659 B2 | 1/2004 | Sakama et al. | |
| 6,803,289 B1 | 10/2004 | Gopalan et al. | |
| 6,927,112 B2 | 8/2005 | Igeta et al. | |
| 7,238,604 B2 | 7/2007 | Kloster et al. | |
| 7,498,270 B2 * | 3/2009 | Gumpher | 438/770 |
| 2004/0166696 A1 | 8/2004 | Lee | |
| 2005/0255714 A1 | 11/2005 | Iyer et al. | |
| 2006/0118892 A1 | 6/2006 | Wu et al. | |

OTHER PUBLICATIONS

P. Temple-Boyer, C. Rossi, E. Saint-Etienne, and E. Scheid. (1998). "Residual Stress in Low-pressure Chemical Vapor Deposition SiNx Films Deposited from Silane and Ammonia" J. Vac. Sci. Technol. A, 16(4), pp. 2003-2007.

\* cited by examiner

*Primary Examiner*—Dung A. Le (57) ABSTRACT

A method for forming a stressed passivation film. In one embodiment, the method includes depositing a silicon nitride film over an integrated circuit structure on a substrate and embedding oxygen into a surface of the silicon nitride film by exposing the silicon nitride film to a process gas containing oxygen radicals formed by non-ionizing electromagnetic radiation induced dissociation of an oxygen-containing gas or an oxygen- and nitrogen-containing gas. The method further includes heat-treating the oxygen-embedded silicon nitride film to form a stressed silicon oxynitride film.

21 Claims, 7 Drawing Sheets

METHOD OF FORMING A STRESSED PASSIVATION FILM USING A NON-IONIZING ELECTROMAGNETIC RADIATION-ASSISTED OXIDATION PROCESS

CROSS-REFERENCE TO RELATED APPLICATIONS

This application is related to co-pending U.S. patent application Ser. No. 12/058,585, entitled "METHOD OF FORMING A STRESSED PASSIVATION FILM USING A MICROWAVE-ASSISTED OXIDATION PROCESS," filed on the same date as the present application, the entire contents of which are hereby incorporated by reference.

FIELD OF THE INVENTION

The present invention relates to forming a stressed passivation film in semiconductor processing, and more particularly to a method of forming a stressed silicon oxynitride film.

BACKGROUND OF THE INVENTION

In the construction of integrated circuit devices, a topside or passivation film of a dielectric material is conventionally provided over the underlying layers containing the integrated circuit structure. This film, in addition to functioning as an insulation film, acts to protect the underlying structure from moisture and ion contamination that can damage or destroy the structure by causing corrosion and electrical shorts.

Silicon nitride is known as a satisfactory insulation layer for forming such a passivation film, due at least in part to its high resistance to moisture and hydrogen penetration. Moreover, the diffusivity of various impurities, such as sodium, is much lower in silicon nitride than in other insulators, such as silicon dioxide. Thus, integrated circuits made with a silicon nitride passivation layer are less susceptible to ionic contamination problems.

Recent innovations to improve complementary metal oxide semiconductor (CMOS) transistor performance have created an industry need for stressed ceramic layers compatible with current ultra-large scale integration (ULSI) techniques. In particular, channel carrier mobility for a negative metal oxide semiconductor (NMOS) transistors can be increased through introduction of tensile uniaxial or biaxial strain on a channel region of a MOS transistor. Typically, this has been accomplished by deposition of highly tensile stressed silicon nitride as a cap layer over the source/drain regions. While other novel materials may be explored for this application, silicon nitride and silicon nitride based materials are preferable due to their compatibility with existing fabrication processes.

SUMMARY OF THE INVENTION

In one embodiment of the present invention, a method is described for forming a stressed passivation film over an integrated circuit structure. The stressed passivation film is formed by depositing a silicon nitride film over the integrated circuit structure and subsequently oxidizing at least a top portion of the silicon nitride film to create or increase stress in the film and improve the performance of the device containing the integrated circuit structure. According to embodiments of the invention, the oxidation process is performed using low-energy excited oxygen species that eliminate or at least significantly reduce oxidation and/or damage to underlying materials and devices.

In one embodiment, the method includes depositing a silicon nitride film over an integrated circuit structure on a substrate and embedding oxygen into a surface of the silicon nitride film by exposing the silicon nitride film to a process gas containing oxygen radicals formed by radiation induced dissociation of an oxygen-containing gas such as oxygen ($O_2$) gas. The method further includes heat-treating the oxygen-embedded silicon nitride film to form a stressed silicon oxynitride film.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

Methods for forming a stressed passivation film in semiconductor processing are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

There is a general need for new methods for forming stressed passivation films under well-controlled process conditions that provide great flexibility for tailoring the material properties and the stress induced in the films that improve device performance. The new methods are needed for replacing ion implantation methods that utilize high kinetic energy ion beams and methods that utilize direct exposure of the films to high kinetic energy oxygen (O) species such as O ions excited by conventional plasma processing systems and plasma processing conditions. These methods to be replaced have several drawbacks, including charging damage of the exposed films and poor control over the depth profiles of elements embedded in the films. These drawbacks become increasingly more important as films in semiconductor devices become increasingly thinner.

In particular, new methods are needed that integrate deposition of silicon nitride or silicon nitride based films and in-situ (without air exposure) oxidation of the silicon nitride or silicon nitride based film by low-energy excited oxygen (O) species in a process gas containing an oxygen-containing gas (e.g., $O_2$, $H_2O$, or $H_2O_2$) or an oxygen- and nitrogen-containing gas (e.g., NO, $N_2O$, or $NO_2$). Embodiments of the invention use low-energy excited oxygen species in an oxidation process where the oxidation of the films does not exceed the thickness of the films, thereby eliminating or at least significantly reducing oxidation and/or damage to underlying materials and devices. The in-situ processing provides excellent control over the extent of film oxidation and oxidation depth profile, and reduces contamination due to the absence of atmospheric exposure during processing.

The silicon nitride films contain silicon (Si) and nitrogen (N), for example as $SiN_x$, and the silicon oxynitride films contain Si, N, and O, for example as $SiN_xO_y$. The silicon nitride based films can, in addition to Si and N, further contain carbon (C), hydrogen (H), or both C and H. Furthermore, the silicon oxynitride films can, in addition to Si, N, and O, further contain C, H, or both C and H. In the following description, silicon nitride films and silicon nitride based films are referred to simply as silicon nitride films. Composition of a silicon oxynitride film can vary from an external surface of the silicon oxynitride film exposed to the low-energy oxygen species to an interface between the silicon oxynitride film and a non-oxidized portion of the silicon nitride film. However, the interface may not be abrupt, but may be described by a smooth, continuous reduction in oxygen concentration from the oxygen content of the external surface of the silicon oxynitride film to the oxygen content of the silicon nitride film. According to an embodiment of the invention, a thickness of the silicon nitride film can be between about 5 nanometers (nm) and about 50 nm and a thickness of a surface layer of the silicon nitride film containing embedded oxygen can be between about 3 nm and about 10 nm.

Figure 1:
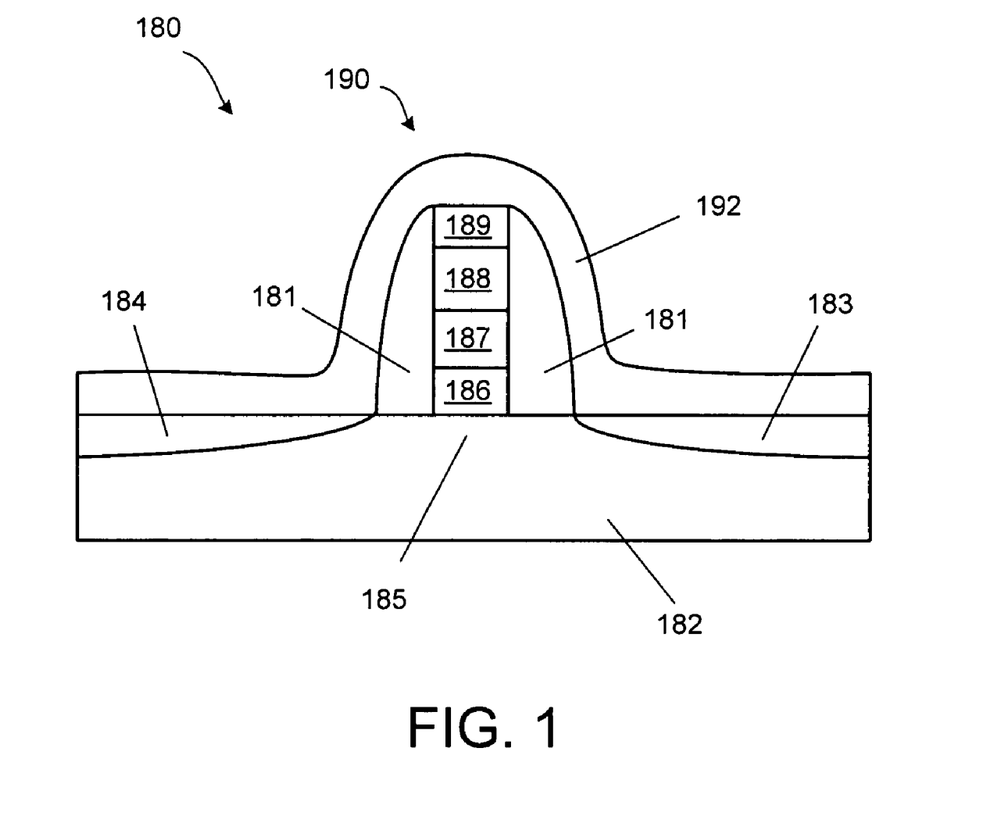
FIG. 1 is a schematic showing a cross-sectional view of a MOS device including a stressed silicon oxynitride film according to an embodiment of the invention.

FIG. 1 is a schematic showing a cross-sectional view of a MOS device including a stressed silicon oxynitride film according to an embodiment of the invention. The device 180 includes a substrate 182 having doped regions 183 and 184 (e.g., source and drain), a gate stack 190, and a stressed silicon oxynitride film 192. The substrate 182 can, for example, be a semiconductor substrate, such as a silicon substrate, a silicon germanium substrate, a germanium substrate, a glass substrate, a LCD substrate, or a compound semiconductor substrate such as for example GaAs. The substrate 182 can be of any size, for example, a 200 mm substrate, a 300 mm substrate, or an even larger substrate.

The gate stack 190 includes a dielectric layer 186 on the channel region 185. The dielectric layer 186 can for example include a silicon dioxide layer, a silicon nitride layer, a silicon oxynitride layer, or a combination thereof, or any other appropriate material. The dielectric layer 186 can further include a high-dielectric constant (high-k) material. The high-k material can for example include a metal oxide, a metal oxynitride, a metal silicate, or a metal silicon oxynitride. Examples of the high-k materials include $Ta_2O_5$, $TiO_2$, $Al_2O_3$, $Y_2O_3$, BaO, $ZrO_2$, $HfO_2$, $SrO_x$, $LaO_x$, $YO_x$, $ZrNO_x$, $HfNO_x$, $ZrSiO_x$, $HfSiO_x$, $TaSiO_x$, $SrSiO_x$, $LaSiO_x$, $YSiO_x$, $ZrSiNO_x$, or $HfSiNO_x$, or a combination of two or more thereof. The high-k material is not limited to the above-mentioned materials and may contain other simple or complex oxides, silicates, and oxynitrides suitable for fabrication of advanced semiconductor devices. In one example, a thickness of the high-k material can between about 1 nm and about 5 nm, or between about 1.2 nm and about 3 nm.

In one embodiment, a conductive layer 187 (e.g., a gate electrode layer) is formed on the dielectric layer 186, and a silicide layer 188 is formed on the conductive layer 187 to reduce the electrical resistance of the conductive layer 187. A cap layer 189 can be positioned at the top of the gate stack 190 to protect the gate stack 190. The cap layer 189 can, for example, be a silicon nitride or silicon oxynitride layer. In one example, the conductive layer 187 can be doped polycrystalline silicon (poly-Si), and the silicide layer 188 can be tungsten silicide. Furthermore, the device 180 and the gate stack 190 may include different and fewer or more layers than shown in FIG. 1. In one example, conductive layer 187 and/or silicide layer 188 may be replaced by a metal gate layer. FIG. 1 further shows a spacer 181 formed on either side of the gate stack 190 in order to protect the gate stack 190 from damage and ensure electrical performance of the gate stack 190. In addition, the spacer 181 can be used as a hard mask for the formation of the source 183 and drain 184 of the MOS device 180. Alternatively, in one embodiment of the present invention, more than one spacer 181 may be used. The MOS device depicted in FIG. 1 may be further processed to complete a semiconductor device.

In one embodiment of the present invention, the device 180 can be a NMOS device where stressed silicon oxynitride film 192 increases channel carrier mobility through introduction of a tensile stress on the channel region 185. The stressed silicon oxynitride film 192 can also serve as a passivation film for protecting the device 180. According to one embodiment of the present invention, the stressed silicon oxynitride film 192 may have a tensile stress equal to or greater than about 1.5 GPa ($1.5 \times 10^9$ Pascal).

Figure 2:
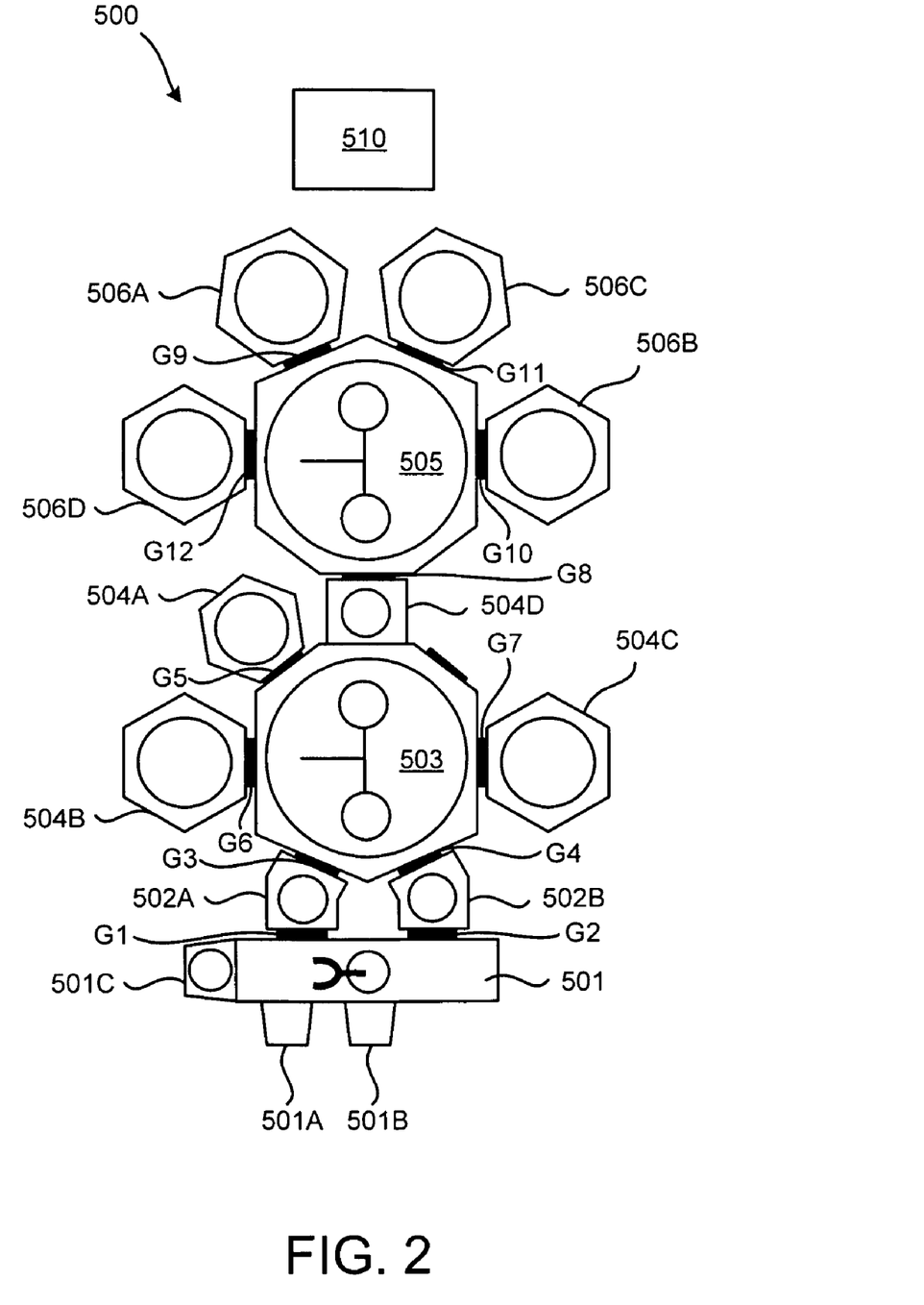
FIG. 2 is a schematic diagram of a vacuum processing tool for forming a stressed silicon oxynitride film according to an embodiment of the invention.

FIG. 2 is a schematic diagram of a vacuum processing tool for forming a stressed silicon oxynitride film according to an embodiment of the invention. The vacuum processing tool 500 contains a first substrate (wafer) transfer system 501 that includes cassette modules 501A and 501B, and a substrate alignment module 501C. Load-lock chambers 502A and 502B are coupled to the substrate transfer system 501 using gate valves G1 and G2, respectively. The first substrate transfer system 501 is maintained at atmospheric pressure but a clean environment is provided by purging with an inert gas. The load lock chambers 502A and 502B are coupled to a second substrate transfer system 503 using gate valves G3 and G4. The second substrate transfer system 503 may be maintained at a base pressure of about 100 mTorr, or lower, using a turbomolecular pump (not shown). The second substrate transfer system 503 includes a substrate transfer robot and is coupled to degassing system 504A, precleaning system 504B for precleaning a substrate or an integrated circuit structure on a substrate prior to further processing, and auxiliary processing system 504C. The processing systems 504A, 504B, and 504C are coupled to the second substrate transfer system 503 using gate valves G5, G6, and G7, respectively.

Furthermore, the second substrate transfer system 503 is coupled to a third substrate transfer system 505 through substrate handling chamber 504D and gate valve G8. As in the second substrate transfer system 503, the third substrate transfer system 505 may be maintained at a base pressure of about 100 mTorr, or lower, using a turbomolecular pump (not shown). The third substrate transfer system 505 includes a substrate transfer robot. Coupled to the third substrate transfer system 505 are first processing system 506A configured for depositing a silicon nitride film on a substrate, and second processing system 506D configured for embedding oxygen into a surface of a silicon nitride film by exposing the silicon nitride film to a process gas containing an oxygen-containing gas (e.g., $O_2$, $H_2O$, or $H_2O_2$) or an oxygen- and nitrogen-containing gas (e.g., NO, $N_2O$, or $NO_2$) exited by plasma induced dissociation using plasma formed by microwave irradiation via a plane antenna member having a plurality of slots. Furthermore, coupled to the third substrate transfer system 505 are third processing system 506B configured for embedding oxygen into a surface of a silicon nitride film by exposing the silicon nitride film to a process gas containing oxygen radicals formed by non-ionizing electromagnetic (e.g., ultraviolet (UV)) radiation induced dissociation of the oxygen-containing gas or the oxygen- and nitrogen-containing gas, and fourth processing system 506C configured for low-pressure heat-treating of silicon oxynitride films following processing of the silicon nitride films in processing systems 506B or 506D. The processing systems 506A, 506B, 506C, and 506D are coupled to the substrate transfer system 505 using gate valves G9, G10, G11, and G12, respectively.

Figure 5:
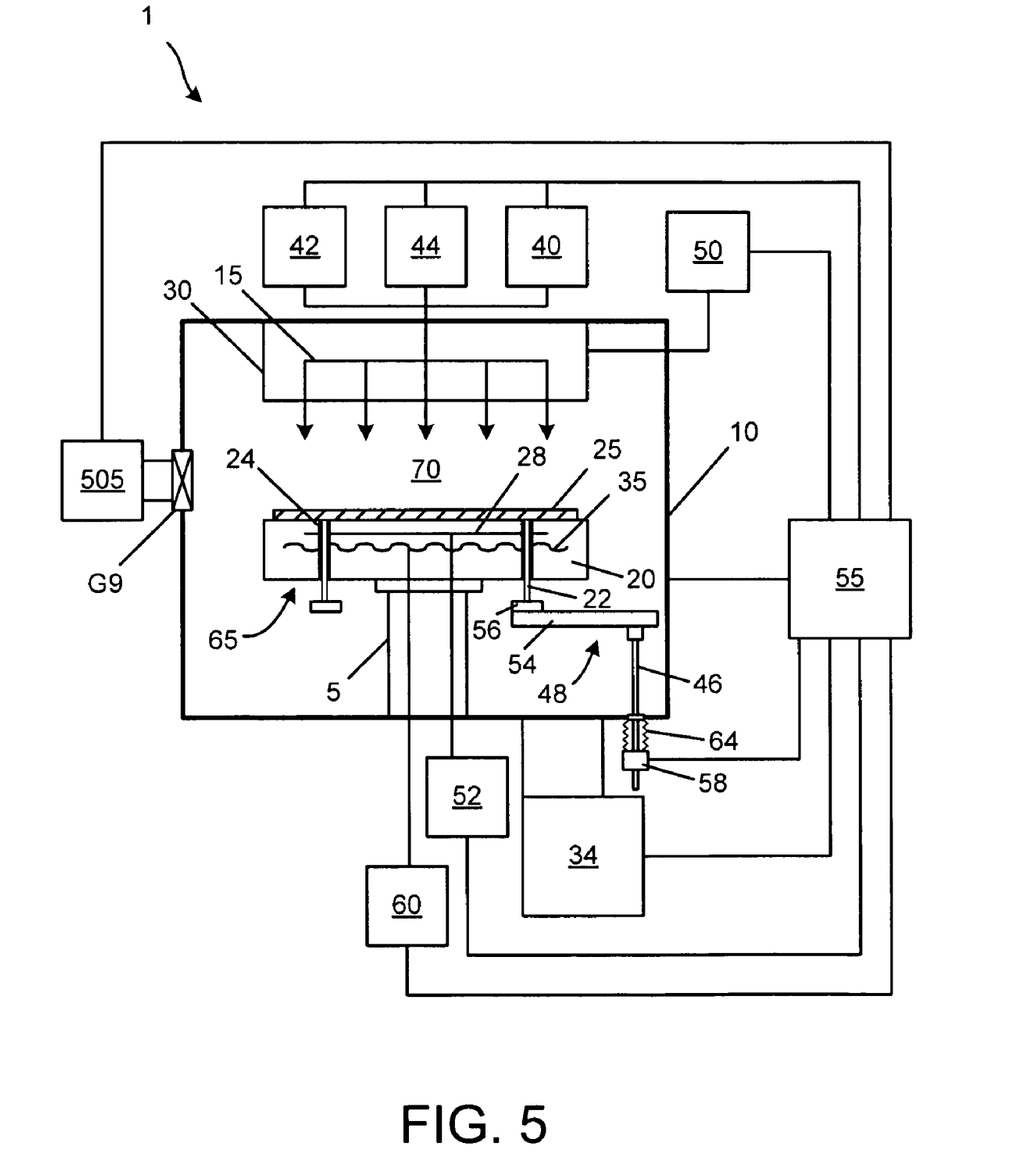
FIG. 5 is a schematic diagram of a film deposition system for depositing a silicon nitride film on a substrate according to one embodiment of the invention.
Figure 6:
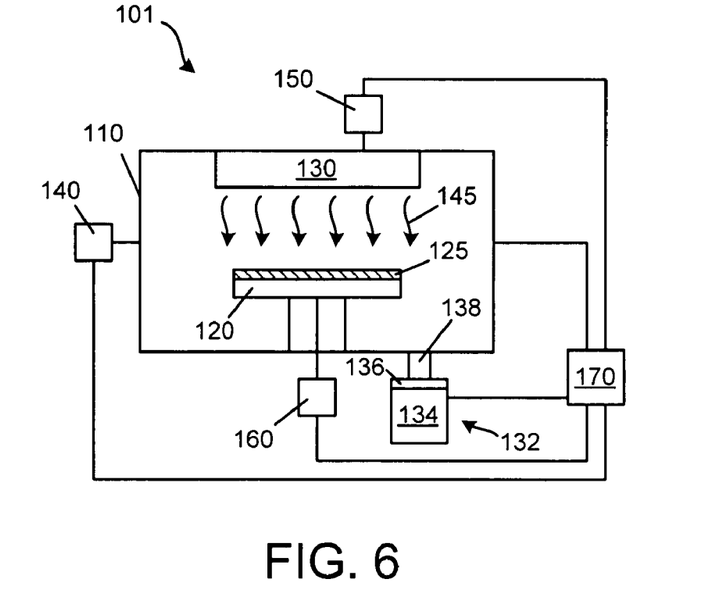
FIG. 6 is a schematic diagram of a processing system containing a non-ionizing electromagnetic radiation source for performing an oxidation process according to one embodiment of the invention.
Figure 7:
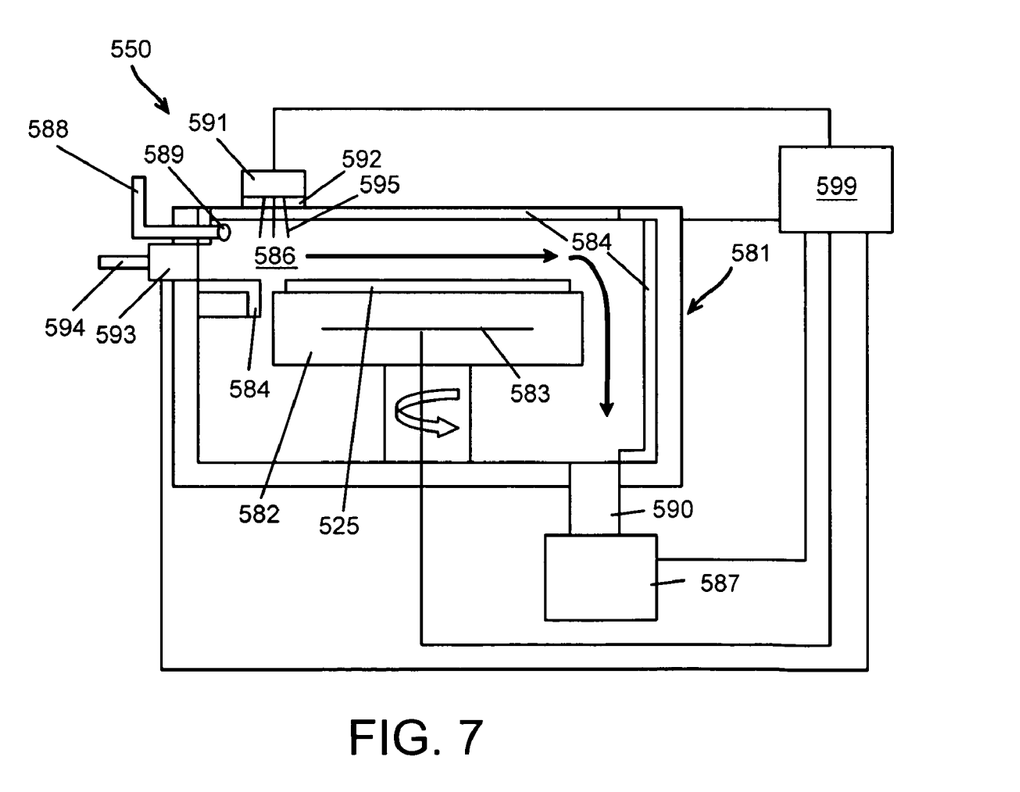
FIG. 7 is a schematic diagram of another processing system containing a non-ionizing electromagnetic radiation source for performing an oxidation process according to one embodiment of the invention.
Figure 8:
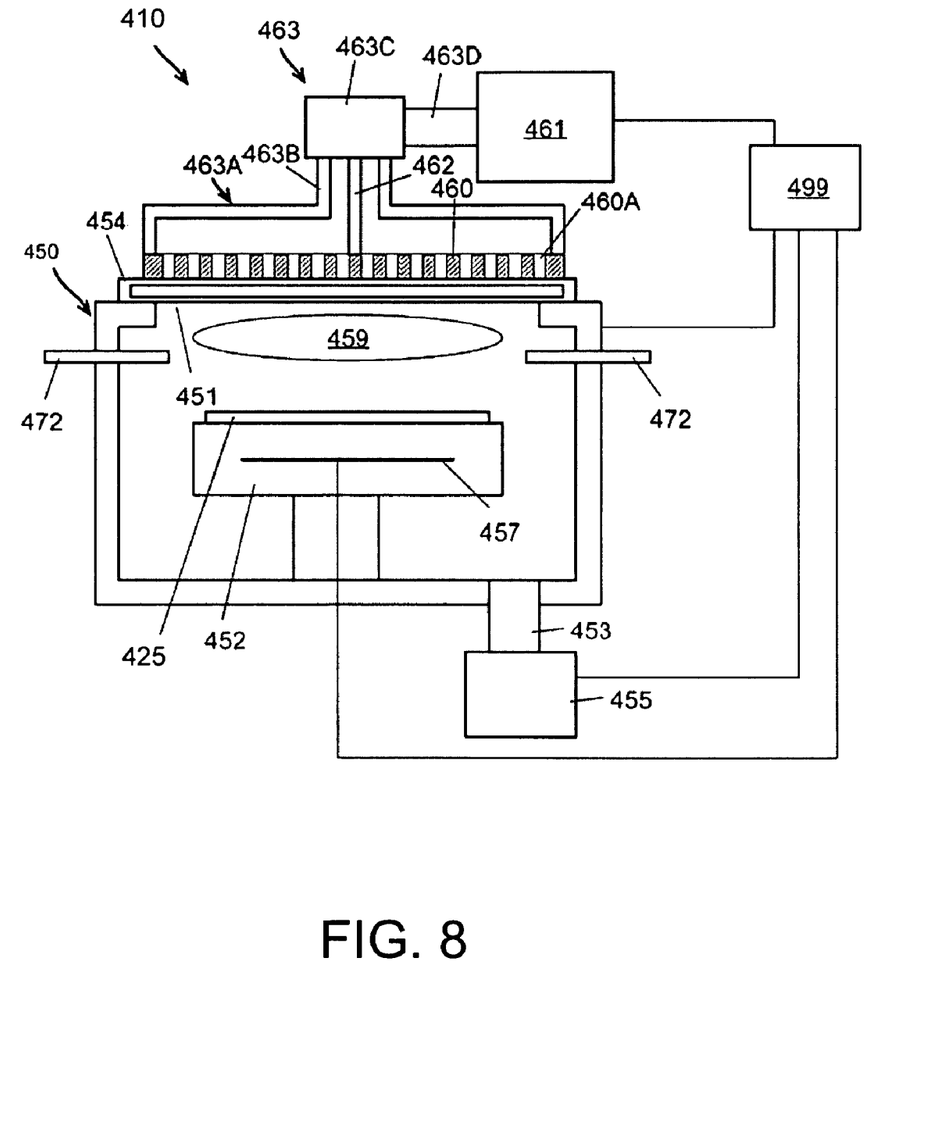
FIG. 8 is a schematic diagram of a plasma processing system containing a slot plane antenna (SPA) plasma source for performing an oxidation process according to one embodiment of the invention.

According to one embodiment of the invention, the first processing system 506A can include a film deposition system 1 schematically shown in FIG. 5. According to an embodiment of the invention, the second processing system 506D can be a plasma processing system containing a slot plane antenna (SPA) plasma source; one example of such a plasma processing system is shown in FIG. 8. According to an embodiment of the invention, the third processing system 506B can be a processing system containing a non-ionizing electromagnetic ultraviolet (UV) excitation source; examples of such a processing system are shown in FIGS. 6 and 7. The third substrate transfer system 505 and processing systems 506A-506D are capable of maintaining a base pressure of background gases at about 100 mTorr, or lower, during the integrated processing, thereby enabling formation of stressed silicon oxynitride films under well-controlled process conditions that provide great flexibility for tailoring the material properties and stress induced in the films.

The vacuum processing tool 500 includes a controller 510 that can be coupled to and control any or all of the processing systems and processing elements depicted in FIG. 2 during the integrated substrate processing. Alternatively, or in addition, controller 510 can be coupled to one or more additional controllers/computers (not shown), and controller 510 can obtain setup and/or configuration information from an additional controller/computer. The controller 510 can be used to configure any or all of the processing systems and processing elements, and the controller 510 can collect, provide, process, store, and display data from any or all of the processing systems and processing elements. The controller 510 can include a number of applications for controlling any or all of the processing systems and processing elements. For example, controller 510 can include a graphic user interface (GUI) component (not shown) that can provide easy to use interfaces that enable a user to monitor and/or control one or more processing systems processing elements.

The controller 510 can include a microprocessor, memory, and a digital I/O port capable of generating control voltages sufficient to communicate, activate inputs, and exchange information with the vacuum processing tool 500 as well as monitor outputs from the vacuum processing tool 500. For example, a program stored in the memory may be utilized to activate the inputs of the vacuum processing tool 500 according to a process recipe in order to perform integrated substrate processing.

However, the controller 510 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 510 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media is software for controlling the controller 510, for driving a device or devices for implementing the invention, and/or for enabling the controller 510 to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The controller 510 may be locally located relative to the vacuum processing tool 500, or it may be remotely located relative to the vacuum processing tool 500. For example, the controller 510 may exchange data with the vacuum processing tool 500 using at least one of a direct connection, an intranet, the Internet and a wireless connection. The controller 510 may be coupled to an intranet at, for example, a customer site (i.e., a device maker, etc.), or it may be coupled to an intranet at, for example, a vendor site (i.e., an equipment manufacturer). Additionally, for example, the controller 510 may be coupled to the Internet. Furthermore, another computer (i.e., controller, server, etc.) may access, for example, the controller 510 to exchange data via at least one of a direct connection, an intranet, and the Internet. As also would be appreciated by those skilled in the art, the controller 510 may exchange data with the vacuum processing tool 500 via a wireless connection.

As those skilled in the art will readily recognize, embodiments of the invention may not require the use of all the processing systems of the vacuum processing tool 500 depicted in FIG. 2. For example, according to one embodiment, either the second processing system 506D or the third processing system 506B are used for embedding oxygen into a silicon nitride film. Thus, some embodiments of the invention may include the use of less than all the processing systems depicted in FIG. 2.

Figure 3:
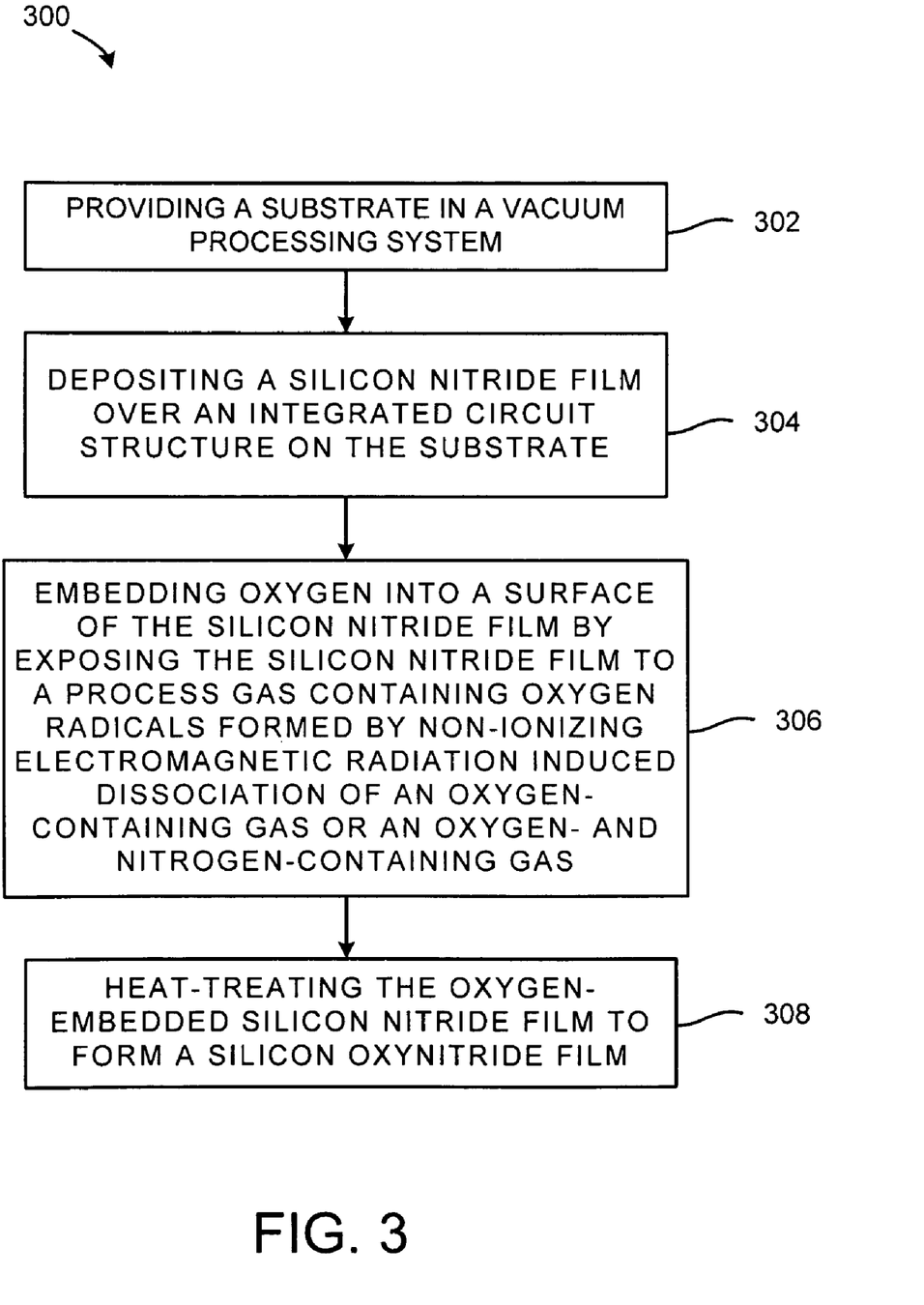
FIG. 3 is a process flow diagram for forming a stressed silicon oxynitride film on a substrate according to an embodiment of the invention.

FIG. 3 is a process flow diagram for forming a stressed silicon oxynitride film on a substrate according to an embodiment of the invention. In block 302 of process flow 300, a substrate is provided in vacuum processing tool, for example vacuum processing tool 500 depicted in FIG. 2. The substrate can, for example, be a Si substrate. A Si substrate can be of n- or p-type, depending on the type of device being formed. The substrate can contain an integrated structure thereon, for example the gate stack 190 depicted in FIG. 1.

According to one embodiment of the invention, the substrate is provided in the cassette modules 501A or 501B for processing in the vacuum processing tool 500. The substrate is introduced into the substrate transfer system 503 from the substrate transfer system 501 through the gate valve G1 and the load lock chamber 502A or through the gate valve G2 and the load lock chamber 502B, after a substrate aligning step in the substrate alignment module 501C. The substrate is then transferred from the substrate transfer system 503 to the processing system 504A through the gate valve G5. In the processing system 504A, the substrate may be degassed by heating and/or exposed to ultraviolet radiation in an inert gas environment to remove water and any residual gas from the substrate.

After degassing in the processing system 504A, the substrate is returned to the substrate transfer system 503 through the gate valve G5, and next the substrate is optionally transported to the (precleaning) processing system 504B through the gate valve G6. Following the optional precleaning, the substrate is returned to the substrate transfer system 503 through the gate valve G6, and then transferred to the substrate transfer system 505 from the substrate handling chamber 504D through the gate valve G8. Once in the substrate transfer system 505, the substrate is introduced into the first processing system 506A through the gate valve G9 for depositing a silicon nitride film on the substrate in block 304.

After deposition of the silicon nitride film in the first processing system 506A, the substrate is returned to the third substrate transfer system 505 through the gate valve G9. Next, the substrate is introduced into the third processing system 506B through the gate valve G10 for embedding oxygen into a surface of the silicon nitride film in block 306. The oxidizing in block 306 includes exposing the silicon nitride film to a process gas containing oxygen radicals formed by non-ionizing electromagnetic radiation induced dissociation of an oxygen-containing gas or an oxygen- and nitrogen-containing gas. In one example, the third processing system 506B can include a processing system 101 schematically shown in FIG. 6. In another example, the third processing system 506B can include a processing system 550 schematically shown in FIG. 7.

Oxidation of a silicon nitride film in the processing system 101 can include a substrate temperature between about 25° C. and about 800° C., for example about 400° C. Alternatively, the substrate temperature can be between about 400° C. and about 700° C. The pressure in the process chamber 450 can, for example, be maintained between about 10 mTorr and about 10 Torr, for example about 50 mTorr. Alternatively, the pressure can be maintained between about 20 mTorr and about 1 Torr.

Following the oxidation process in block 306, the substrate is returned to the substrate transfer system 505 through the gate valve G12 and introduced into the fourth processing system 506C through the gate valve G11 for heat-treating the oxygen-embedded silicon nitride film in block 308 to form a silicon oxynitride film with a desired oxygen depth profile (oxygen concentration as a function of depth in the silicon oxynitride film) and to improve the electrical and material properties of the silicon oxynitride film.

According to embodiments of the invention, the heat-treating can be performed in the fourth processing system 506C as described above, but alternatively or in addition, the heat-treating may be performed in processing systems 506A, 506B, or 506D. According to one embodiment, the step of embedding oxygen into a surface of the silicon nitride film in block 306 can at least partially overlap with the heat-treating step in block 308. According to another embodiment, the steps in blocks 306 and 308 may have no temporal overlap. The heat-treating conditions can include a pressure of about 50 mTorr to about 760 Torr, or a pressure of about 1 Torr to about 10 Torr, using a gas containing $O_2$, $N_2$, $H_2$, Ar, He, Ne, Xe, or Kr, or any combination thereof at a flow rate of 0 to 20 standard liters per minute (slm), or at a flow rate of 0.1 slm to 5 slm. The heat-treating may be carried out for a time period between about 5 seconds and about 5 minutes, or between about 30 seconds and about 2 minutes.

After the heat-treating in block 308, the heat-treated substrate is returned to the substrate transfer system 505 and to the substrate transfer system 503 through the gate valve G11 and the substrate handling chamber 504D. Thereafter, the substrate is returned to the substrate transfer system 501 from the substrate transfer system 503 through the gate valve G3, load lock chamber 502A and the gate valve G1, or through the gate valve G4, the load lock chamber 502B and the gate valve G2. Next, the substrate is returned to the cassette module 501A or 501B and removed from the vacuum processing tool 500.

According to one embodiment of the invention, the depositing and oxidizing steps in blocks 304 and 306 may be sequentially performed any number of times to form a plurality of oxygen-embedded silicon nitride films that may subsequently be heat-treated in block 308 to form a plurality of silicon oxynitride films. Alternatively, each of the oxygen-embedded silicon nitride films may be heat-treated before the next silicon nitride film is deposited thereon. According to one embodiment, the step of embedding oxygen into a surface of the silicon nitride film in block 306 can at least partially overlap with the heat-treating step in block 308.

Figure 4:
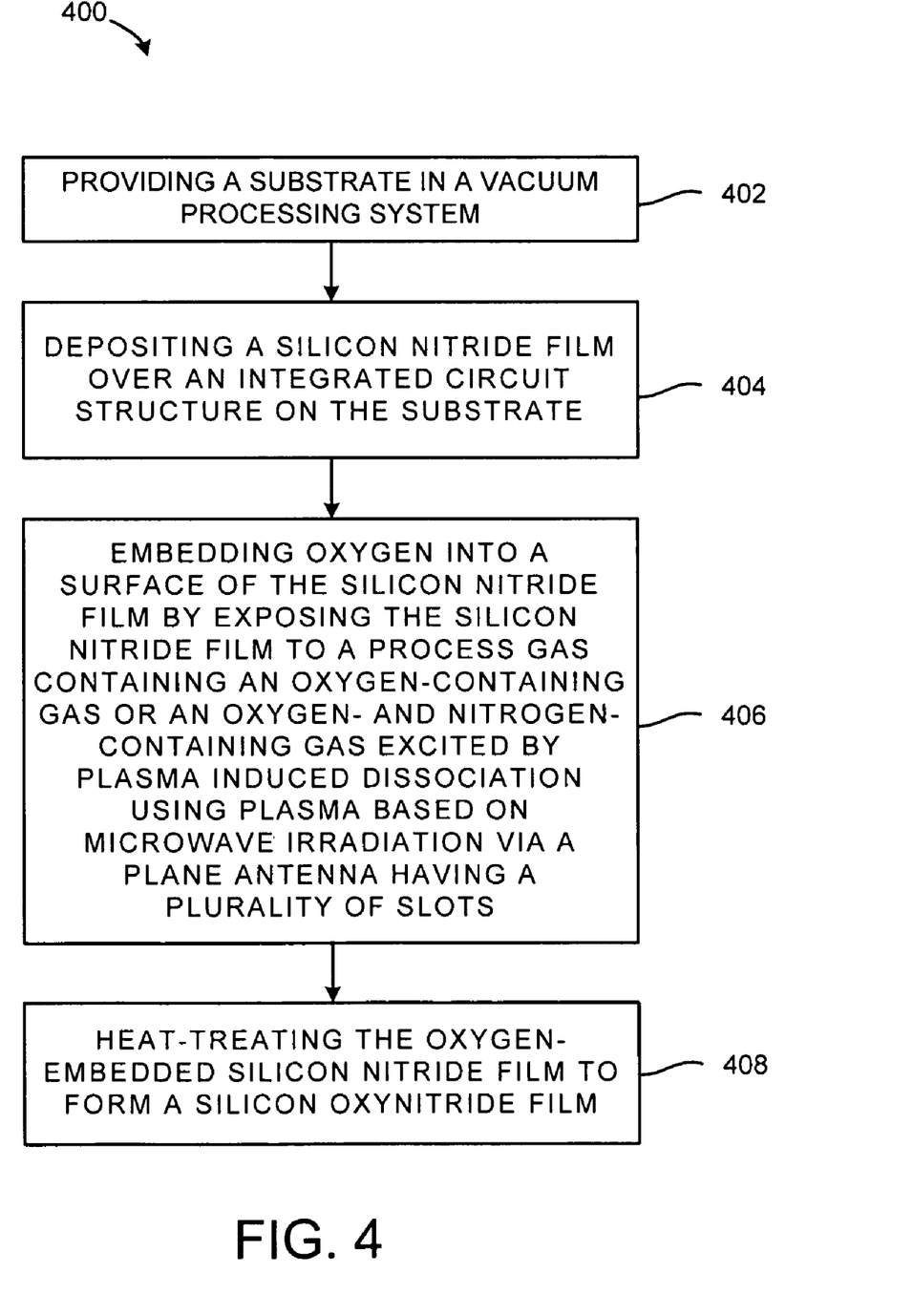
FIG. 4 is a process flow diagram for forming a stressed silicon oxynitride film on a substrate according to another embodiment of the invention.

FIG. 4 is a process flow diagram for forming a stressed silicon oxynitride film on a substrate according to another embodiment of the invention. The process flow 400 in FIG. 4 is similar to the process flow 300 in FIG. 3, and includes, in block 402, providing a substrate in a vacuum processing tool, for example vacuum processing tool 500 depicted in FIG. 2. The substrate can, for example, be a Si substrate. A Si substrate can be of n- or p-type, depending on the type of device being formed. The substrate can contain an integrated structure thereon, for example the gate stack 190 depicted in FIG. 1. After degassing and optional precleaning, the substrate is introduced into the first processing system 506A through the gate valve G9 for depositing a silicon nitride film on the substrate in block 404. After deposition of the silicon nitride film, the substrate is returned to the substrate transfer system 505 through the gate valve G9.

Next, the substrate is introduced into the second processing system 506D through the gate valve G12 for embedding oxygen into a surface of the silicon nitride film in block 406. The oxidizing includes exposure to a process gas containing an oxygen-containing gas or an oxygen- and nitrogen-containing gas excited by plasma induced dissociation using plasma based on microwave irradiation via a plane antenna member having a plurality of slots, where the plane antenna member faces an upper surface of a substrate to be processed. In one example, the second processing system 506D can include a plasma processing system 410 schematically shown in FIG. 8.

According to one embodiment of the invention, the oxidizing in block 406 can further include simultaneously exposing the silicon nitride film to oxygen radicals formed by remote plasma induced dissociation of a second process gas comprising an oxygen-containing gas or an oxygen- and nitrogen-containing gas. The remote plasma source is coupled to the process chamber containing the silicon nitride film. Thus, the silicon nitride film is not exposed directly to the remote plasma source but to oxygen radicals formed by the remote plasma induced dissociation of the second process gas. The remote plasma source can couple radio frequency (RF) power to the second process gas, and the oxygen radicals are subsequently flowed into the process chamber using the gas line and exposed to the silicon nitride film. In one example, the plasma processing system 410 schematically shown in FIG. 8 is configured for exposing the silicon nitride film to oxygen radicals formed by remote plasma induced dissociation of a process gas comprising an oxygen-containing gas or an oxygen- and nitrogen-containing gas. According to one embodiment of the invention, exposure of the silicon nitride film to the oxygen radicals from the remote plasma source and to the oxygen gas excited by plasma induced dissociation based on microwave irradiation via a plane antenna member having plurality of slots can have at least partial temporal overlap. According to another embodiment, the exposures of the silicon nitride film to oxygen radicals formed by the remote plasma source can be performed before or after the embedding in block 406.

Next, the substrate is returned to the substrate transfer system 505 through the gate valve G12 and introduced into the fourth processing system 506C through the gate valve G11 for heat-treating the oxygen-embedded silicon nitride film in block 408. Next, the heat-treated substrate is returned to the substrate transfer system 505 and removed from the vacuum processing tool 500 as described above.

FIG. 5 is a schematic diagram of a film deposition system for depositing a silicon nitride film on a substrate according to one embodiment of the invention. The film deposition system 1 is capable of depositing a silicon nitride film on substrate 25 by a thermal chemical vapor deposition (CVD) process, a plasma-enhanced CVD (PECVD) process, or an atomic layer deposition (ALD) process, for example. The film deposition system 1 contains a process chamber 10 having a substrate holder 20 configured to support the substrate 25 to be processed. The substrate holder 20 is mounted on a pedestal 5 on a lower surface 65 of the substrate holder 20.

The substrate 25 is transferred into and out of the process chamber 10 through a gate valve G9 via substrate transfer system 505. When transferred into the process chamber 10, the substrate 25 is received by a lift mechanism 48 containing substrate lift pins 22 housed in holes 24 within the substrate holder 20. The film deposition system 1 contains three lift pins 22 (only two are shown in FIG. 5). The lift pins 22 are made of quartz or a ceramic material such as $Al_2O_3$, $SiO_2$, or AlN. Once the substrate 25 is received from the substrate transfer system 505, it is lowered to an upper surface of the substrate holder 20. The lower end portion of each lift pin 22 rests against a support plate 56 attached to an arm 54. The arm 54 is connected to a rod 46 of an actuator 58 positioned below the process chamber 10. The rod 46 extends through bellows 64 positioned at the bottom on the process chamber 10.

The process chamber 10 contains an upper assembly 30 coupled to a first process material supply system 40, a second process material supply system 42, and a purge gas supply system 44. The upper assembly 30 can contain a showerhead having a large number of gas delivery holes formed in a lower surface of the showerhead and facing the substrate 25 for delivering gases 15 into processing space 70 above the substrate 25. The first process material supply system 40 and the second process material supply system 42 can be configured to simultaneously or alternately introduce first and second process materials to the process chamber 10. The alternation of the introduction of the first and second process materials can be cyclical, or it may be acyclical with variable time periods between introduction of the first and second process materials.

The first process material can contain a deposition gas containing a silicon precursor which may be delivered to process chamber 10 in a gaseous phase with or without the use of a carrier gas. The second process material can contain a reducing agent, which may include a nitrogen precursor containing nitrogen to be incorporated in a silicon nitride film formed on the substrate 25. For instance, the reducing agent may be delivered to process chamber 10 in a gaseous phase with or without the use of a carrier gas. Examples of silicon precursors include silane ($SiH_4$), disilane ($Si_2H_6$), monochlorosilane ($SiH_3Cl$), dichlorosilane ($SiH_2Cl_2$), trichlorosilane ($SiHCl_3$), hexachlorodisilane ($Si_2Cl_6$), tetrakis(dimethylamino)silane (TDMAS), tris(dimethylamino)silane (TrDMAS), diethylsilane ($Et_2SiH_2$), tetrakis(ethylmethylamino)silane (TEMAS), bis(diethylamino)silane, bis(di-isopropylamino) silane (BIPAS), tris(isopropylamino)silane (TIPAS), (di-isopropylamino)silane (DIPAS), and bis(tertiarybutylamino)silane (BTBAS). Examples of nitrogen precursors include $N_2$, $NH_3$, $N_2H_4$, and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe).

Exemplary processing conditions during deposition of a silicon nitride film include a substrate temperature between about 400° C. and about 800° C., for example about 700° C., and a process chamber pressure between about 50 mTorr and about 200 Torr, for example about 1 Torr.

The purge gas supply system 44 is configured to introduce a purge gas to process chamber 10. For example, the introduction of purge gas may occur during and/or between introduction of the first and second process materials to the process chamber 10, or following the introduction of the second process material to process chamber 10. The purge gas can contain an inert gas, such as a noble gas (i.e., helium, neon, argon, xenon, krypton), or nitrogen ($N_2$), or hydrogen ($H_2$).

The film deposition system 1 contains a plasma generation system configured to optionally generate plasma in the processing space 70 during deposition of the silicon nitride film. The plasma generation system includes a first power source 50 coupled to the process chamber 10 and configured to couple power to the first process material, or the second process material, or both, in the processing space 70 by energizing the upper assembly 30. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, T-type, T-type, etc.) and automatic control methods are well known to those skilled in the art. A typical frequency for the application of RF power to the electrode formed in the upper assembly 30 can, for example, range from 10 MHz to 200 MHz and can be 60 MHz, and the RF power applied can, for example, be between about 500 Watts (W) and about 2200 W.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

The film deposition system 1 contains a substrate bias system configured to optionally generate or assist in generating plasma during deposition of the silicon nitride film. The substrate bias system includes a substrate power source 52 coupled to the process chamber 10, and configured to couple power to the substrate holder 20. The substrate power source 52 contains a RF generator and an impedance match network. The substrate power source 52 is configured to couple power to the first process material, or the second process material, or both, in the processing space 70 by energizing an electrode 28 in the substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the electrode 28 at multiple frequencies.

The film deposition system 1 contains a substrate temperature control system 60 coupled to the substrate holder 20 and configured to elevate, lower, and control the temperature of substrate 25. The substrate temperature control system 60 is coupled to a resistive heating element 35 in the substrate holder 20. The substrate temperature control system 60 can further contain temperature control elements, such as a cooling system including a re-circulating coolant flow that receives heat from the substrate holder 20 and transfers heat to a heat exchanger system (not shown). Additionally, the temperature control elements can include heating/cooling elements which can be included in the substrate holder 20, as well as the chamber wall of the process chamber 10 and any other component within the film deposition system 1.

In order to improve the thermal transfer between the substrate 25 and the substrate holder 20, the substrate holder 20 can include a mechanical clamping system, or an electrical clamping system, such as an electrostatic clamping system, to affix the substrate 25 to an upper surface of substrate holder 20. Furthermore, the substrate holder 20 can further include a substrate backside gas delivery system configured to introduce gas to the backside of substrate 25 in order to improve the gas-gap thermal conductance between the substrate 25 and the substrate holder 20. Such a system can be utilized when good temperature control of the substrate 25 is required at elevated or reduced temperatures. For example, the substrate backside gas system can contain a two-zone gas distribution system, wherein the helium gas gap pressure can be independently varied between the center and the edge of the substrate 25.

Furthermore, the process chamber 10 is coupled to a pressure control system 34 that includes a vacuum pumping system and a variable gate valve for controllably evacuating the process chamber 10 to a pressure suitable for processing the substrate 25, and suitable for use of the first and second process materials. The vacuum pumping system can include a turbo-molecular vacuum pump (TMP) or a cryogenic pump capable of a pumping speed up to about 5000 liters per second (and greater). In conventional plasma processing devices utilized for thin film deposition or dry etching, a 300 to 5000 liter per second TMP is generally employed. Moreover, a device for monitoring chamber pressure, for example a capacitance manometer (not shown) can be coupled to the process chamber 10.

The film deposition system 1 contains a controller 55 that is coupled to the process chamber 10, pressure control system 34, first process material supply system 40, second process material supply system 42, purge gas supply system 44, first power source 50, substrate power source 52, actuator 58, substrate temperature control system 60, and substrate transfer system 505. In addition, the controller 55 can be coupled to one or more additional controllers/computers (not shown), and the controller 55 can obtain setup and/or configuration information from an additional controller/computer. The controller 55 can be used to configure, collect, provide, process, store, and display data from the film deposition system 1. The controller 55 can contain a number of applications for controlling the film deposition system 1. For example, controller 55 can include a graphic user interface (GUI) component (not shown) that can provide easy to use interfaces that enable a user to monitor and/or control the film deposition system 1.

The controller 55 can contain a microprocessor, memory, and a digital I/O port capable of generating control voltages sufficient to communicate and activate inputs to the film deposition system 1 as well as monitor outputs from the film deposition system 1. For example, a program stored in the memory may be utilized to activate the inputs of the film deposition system 1 according to a process recipe in order to perform a film deposition process. The controller 55 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 55 includes at least one computer readable medium or memory, such as the controller memory, for holding instructions programmed according to the teachings of the invention and for containing data structures, tables, records, or other data that may be necessary to implement embodiments of the invention. Stored on any one or on a combination of computer readable media, the present invention includes software for controlling the controller 55, for driving a device or devices for implementing embodiments of the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

FIG. 6 is a schematic diagram of a processing system containing a non-ionizing electromagnetic radiation source for performing an oxidation process according to one embodiment of the invention. The radiation source can be a UV radiation source or a visible light radiation source, for example. The processing system 101 contains a process chamber 110 having a substrate holder 120 configured to support a substrate 125. The process chamber 110 further contains an electromagnetic radiation assembly 130 for exposing the substrate 125 to electromagnetic radiation. Additionally, the processing system 101 contains a power source 150 coupled to the electromagnetic radiation assembly 130, and a substrate temperature control system 160 coupled to substrate holder 120 and configured to elevate and control the temperature of substrate 125. A gas supply system 140 is coupled to the process chamber 110, and configured to introduce a process gas to process chamber 110. For example, the process gas can include an oxygen-containing gas or an oxygen- and nitrogen-containing gas and optionally an inert gas such as a noble gas (i.e., helium, neon, argon, xenon, krypton). According to one embodiment of the invention, the process gas consists of $O_2$. Additionally (not shown), a purge gas can be introduced to process chamber 110. The purge gas may contain an inert gas, such as nitrogen or a noble gas.

The electromagnetic radiation assembly 130 can, for example, contain an ultraviolet (UV) radiation source. The UV source may be monochromatic or polychromatic. Additionally, the UV source can be configured to produce UV radiation 145 at a wavelength sufficient for dissociating an oxygen-containing gas or an oxygen- and nitrogen-containing gas in the process gas. In one embodiment, the oxygen-containing gas can contain $O_2$ and the ultraviolet radiation can have a wavelength from about 145 nm to about 192 nm. Other wavelength may be used for other oxygen-containing gases or oxygen- and nitrogen-containing gases. The electromagnetic radiation assembly 130 can operate at a power ranging from about 5 mW/cm$^2$ to about 50 mW/cm$^2$. The electromagnetic radiation assembly 130 can include one, two, three, four, or more radiation sources. The sources can include lamps or lasers or a combination thereof.

The processing system 101 contains a substrate temperature control system 160 coupled to the substrate holder 120 and configured to elevate and control the temperature of substrate 125. Substrate temperature control system 160 contains temperature control elements, such as a heating system that may contain resistive heating elements, or thermoelectric heaters/coolers. Additionally, substrate temperature control system 160 may contain a cooling system including a re-circulating coolant flow that receives heat from substrate holder 120 and transfers heat to a heat exchanger system (not shown), or when heating, transfers heat from the heat exchanger system. Furthermore, the substrate temperature control system 160 may include temperature control elements disposed in the chamber wall of the process chamber 110 and any other component within the processing system 101.

Furthermore, the process chamber 110 is further coupled to a pressure control system 132, including a vacuum pumping system 134 and a valve 136, through a duct 138, wherein the pressure control system 132 is configured to controllably evacuate the process chamber 110 to a pressure suitable for processing the substrate 125. Moreover, a device for monitoring chamber pressure (not shown) can be coupled to the process chamber 110.

Additionally, the processing system 101 contains a controller 170 coupled to the process chamber 110, vacuum pumping system 134, gas supply system 140, power source 150, and substrate temperature control system 160. Alternatively, or in addition, controller 170 can be coupled to a one or more additional controllers/computers (not shown), and controller 170 can obtain setup and/or configuration information from an additional controller/computer.

The controller 170 can contain a microprocessor, memory, and a digital I/O port capable of generating control voltages sufficient to communicate and activate inputs to processing system 101 as well as monitor outputs from processing system 101. For example, a program stored in the memory may be utilized to activate the inputs to the aforementioned components of the processing system 101 according to a process recipe in order to perform process.

Oxidation of a silicon nitride film in the processing system 101 can include a substrate temperature between about 200° C. and about 800° C., for example about 700° C. Alternatively, the substrate temperature can be between about 400° C. and about 700° C. The pressure in the process chamber 110 can, for example, be maintained between about 10 mTorr and about 20 Torr, for example about 100 mTorr. Alternatively, the pressure can be maintained between about 20 mTorr and about 1 Torr. According to one embodiment of the invention, the process gas consists of $O_2$ that may be introduced into the process chamber 110 at a flow rate between about 100 standard cubic centimeters per minute (sccm) and about 2 slm. According to another embodiment of the invention, the process gas can consist of $O_2$ and an inert gas such as a noble gas (i.e., helium, neon, argon, xenon, krypton). A flow rate of the inert gas can, for example, be between 0 slm and about 2 slm, or between 0.1 slm and 1 slm. In one example, the process gas consists of $O_2$ and Ar. Exemplary gas exposure times are between about 10 seconds and about 5 min, or between about 30 seconds and about 2 minutes, for example about 1 minute.

FIG. 7 is a schematic diagram of another processing system containing a non-ionizing radiation source for performing an oxidation process according to one embodiment of the invention. The radiation source can be a UV radiation source or a visible light radiation source, for example. The processing system 550 includes a process chamber 581 accommodating therein a rotatable substrate holder 582 equipped with a heater 583 that can be a resistive heater. Alternatively, the heater 583 may be a lamp heater or any other type of heater. Furthermore the process chamber 581 contains an exhaust line 590 connected to the bottom portion of the process chamber 581 and to a vacuum pump 587. The substrate holder 582 can be rotated by a drive mechanism (not shown). The process chamber 581 contains a processing space 586 above the substrate 525. The inner surface of the process chamber 581 contains an inner liner 584 made of quartz in order to suppress metal contamination of the substrate 525 to be processed.

The process chamber 581 contains a gas line 588 with a nozzle 589 located opposite the exhaust line 590 for flowing a process gas containing an oxygen-containing gas or an oxygen- and nitrogen-containing gas over the substrate 525. The process gas flows over the substrate 525 in a processing space 586 and is evacuated from the process chamber 581 by the exhaust line 590.

The process gas supplied from the nozzle 589 is activated by non-ionizing electromagnetic radiation 595 generated by an electromagnetic radiation source 591 emitting non-ionizing electromagnetic radiation 595 through a transmissive window 592 (e.g., quartz) into the processing space 586 between the nozzle 589 and the substrate 525. The electromagnetic radiation source 591 is configured to generate non-ionizing electromagnetic radiation 595 capable of dissociating the oxygen-containing gas or the oxygen- and nitrogen-containing gas to form neutral O radicals that flow along the surface of the substrate 100, thereby exposing the substrate 525 to the neutral O radicals. Unlike during plasma processing, substantially no ions are formed in the processing space 586 from dissociation of the oxygen-containing gas or oxygen- and nitrogen-containing gas by the UV radiation 595. According to one embodiment of the invention, the electromagnetic radiation source 591 is configured to generate UV radiation with a wavelength between about 145 nm to about 192 nm, for example 172 nm. Although only one electromagnetic radiation source 591 is depicted in FIG. 7, other embodiments of the invention contemplate the use of a plurality of electromagnetic radiation sources 591 above the substrate 525.

Furthermore, the process chamber 581 contains a remote RF plasma source 593 located opposite the exhaust line 590. The remote RF plasma source 593 may be utilized to form neutral and ionized plasma-excited species that may assist in the non-ionizing electromagnetic radiation-assisted oxidation process described above. A second process gas containing an oxygen-containing gas or an oxygen- and nitrogen-containing gas can be supplied by gas line 594 to the remote RF plasma source 593 for forming the plasma-excited oxidation species. The plasma-excited oxidation species flow from the remote RF plasma source 593 along the surface of the substrate 525, thereby exposing the substrate 525 to the plasma-excited oxidation species. According to one embodiment of the invention, in addition to exposing the substrate 525 to neutral O radicals generated by the electromagnetic radiation source 591, the substrate may be exposed to oxygen radicals generated by the remote RF plasma source 593 and transported to the processing space 586.

Still referring to FIG. 7, a controller 599 includes a microprocessor, a memory, and a digital I/O port capable of generating control voltages sufficient to communicate and activate inputs of the processing system 550 as well as monitor outputs from the processing system 550. Moreover, the controller 599 is coupled to and exchanges information with process chamber 581, the vacuum pump 587, the heater 583, the remote RF plasma source 593, and the electromagnetic radiation source 591. The controller 599 may be implemented as a UNIX-based workstation. Alternatively, the controller 599 can be implemented as a general-purpose computer, digital signal processing system, etc.

Further details of a processing system containing an UV radiation source are described in U.S. Pat. No. 6,927,112, titled "Radical Processing Of A Sub-Nanometer Insulation Film", the entire contents of which is hereby incorporated by reference.

Oxidation of a silicon nitride film in the processing system 550 can include a substrate temperature between about 200° C. and about 800° C., for example about 700° C. Alternatively, the substrate temperature can be between about 400° C. and about 700° C. The pressure in the process chamber 110 can, for example, be maintained between about 10 mTorr and about 20 Torr, for example about 100 mTorr. Alternatively, the pressure can be maintained between about 20 mTorr and about 1 Torr. According to one embodiment of the invention, the process gas consists of $O_2$ that may be introduced into the process chamber 581 at a flow rate between about 100 sccm and about 2 slm. According to another embodiment of the invention, the process gas can consist of $O_2$ and an inert gas such as a noble gas. A flow rate of the inert gas can, for example, be between 0 sccm and about 2 slm. In one example, the process gas consists of $O_2$ and Ar. Exemplary gas exposure times are between about 10 sec and about 5 min, for example about 1 min.

FIG. 8 is a schematic diagram of a plasma processing system containing a slot plane antenna (SPA) plasma source for performing an oxidation process according to one embodiment of the invention. The plasma produced in the plasma processing system 410 is characterized by low electron temperature and high plasma density that enables damage-free oxidation of silicon nitride films according to embodiments of the invention. The plasma processing system 410 can, for example, be a TRIAS™ SPA processing system from Tokyo Electron Limited, Akasaka, Japan. The plasma processing system 410 contains a process chamber 450 having an opening portion 451 in the upper portion of the process chamber 450 that is larger than a substrate 425. A cylindrical dielectric top plate 454 made of quartz or aluminum nitride or aluminum oxide is provided to cover the opening portion 451. Gas lines 472 are located in the side wall of the upper portion of process chamber 450 below the top plate 454. In one example, the number of gas lines 472 can be 16 (only two of which are shown in FIG. 8). Alternatively, a different number of gas lines 472 can be used. The gas lines 472 can be circumferentially arranged in the process chamber 450, but this is not required for the invention. A process gas can be evenly and uniformly supplied into the plasma region 459 in process chamber 450 from the gas lines 472. The process gas can contain an oxygen-containing gas (e.g., $O_2$, $H_2O$, or $H_2O_2$), an oxygen- and nitrogen-containing gas (e.g., NO, $N_2O$, or $NO_2$), or a combination thereof. The process gas can further contain an inert gas such as Ar.

In the plasma processing system 410, microwave power is provided to the process chamber 450 through the top plate 454 via a slot plane antenna 460 having a plurality of slots 460A. The slot plane antenna 460 faces the substrate 425 to be processed and the slot plane antenna 460 can be made from a metal plate, for example copper. In order to supply the microwave power to the slot plane antenna 460, a waveguide 463 is disposed on the top plate 454, where the waveguide 463 is connected to a microwave power supply 461 for generating microwaves with a frequency of about 2.45 GHz, for example. The waveguide 463 contains a flat circular waveguide 463A with a lower end connected to the slot plane antenna 460, a circular waveguide 463B connected to the upper surface side of the circular waveguide 463A, and a coaxial waveguide converter 463C connected to the upper surface side of the circular waveguide 463B. Furthermore, a rectangular waveguide 463D is connected to the side surface of the coaxial waveguide converter 463C and the microwave power supply 461.

Inside the circular waveguide 463B, an axial portion 462 of an electroconductive material is coaxially provided, so that one end of the axial portion 462 is connected to the central (or nearly central) portion of the upper surface of slot plane antenna 460, and the other end of the axial portion 462 is connected to the upper surface of the circular waveguide 463B, thereby forming a coaxial structure. As a result, the circular waveguide 463B is constituted so as to function as a coaxial waveguide. The microwave power can, for example, be between about 0.5 W/cm$^2$ and about 4 W/cm$^2$. Alternatively, the microwave power can be between about 0.5 W/cm$^2$ and about 3 W/cm$^2$. The microwave irradiation may contain a microwave frequency of about 300 MHz to about 10 GHz and the plasma may contain an electron temperature of less than about 3 eV, which includes 0.1, 0.3, 0.5, 0.7, 0.9, 1, 1.5, 2, 2.5, or 3 eV, or any combination thereof. The plasma may have a density of about $1\times10^{11}$/cm$^3$ to about $1\times10^{13}$/cm$^3$, or higher.

In addition, in the process chamber 450, a substrate holder 452 is provided opposite the top plate 454 for supporting and heating a substrate 425 (e.g., a wafer). The substrate holder 452 contains a heater 457 to heat the substrate 425, where the heater 457 can be a resistive heater. Alternatively, the heater 457 may be a lamp heater or any other type of heater. Furthermore the process chamber 450 contains an exhaust line 453 connected to the bottom portion of the process chamber 450 and to a vacuum pump 455.

Still referring to FIG. 8, a controller 499 includes a microprocessor, a memory, and a digital I/O port capable of generating control voltages sufficient to communicate and activate inputs of the plasma processing system 410 as well as monitor outputs from the plasma processing system 410. Moreover, the controller 499 is coupled to and exchanges information with process chamber 450, the vacuum pump 455, the heater 457, and the microwave power supply 461. A program stored in the memory is utilized to control the aforementioned components of plasma processing system 410 according to a stored process recipe. One example of controller 499 is a UNIX-based workstation. Alternatively, the controller 499 can be implemented as a general-purpose computer, digital signal processing system, etc.

Oxidation of a silicon nitride film in the plasma processing system 410 can include a substrate temperature between about 25° C. and about 800° C., for example about 400° C. Alternatively, the substrate temperature can be between about 400° C. and about 700° C. The pressure in the process chamber 450 can, for example, be maintained between about 10 mTorr and about 10 Torr, for example about 100 mTorr. Alternatively, the pressure can be maintained between about 20 mTorr and about 1 Torr. According to one embodiment of the invention, the process gas consists of O$_2$ that may be introduced into the process chamber 581 at a flow rate between about 5 sccm and about 1 slm. According to another embodiment of the invention, the process gas can consist of O$_2$ and an inert gas such as a noble gas. A flow rate of the inert gas can, for example, be between 0 sccm and about 5 slm. In one example, the process gas consists of O$_2$ and Ar. Exemplary gas exposure times are between about 5 sec and about 5 min, for example about 20 sec.

A plurality of embodiments for depositing silicon nitride films and subsequently forming stressed silicon oxynitride films have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a stressed passivation film, comprising:
   depositing a silicon nitride film over an integrated circuit structure on a substrate;
   embedding oxygen into a surface of the silicon nitride film by exposing the silicon nitride film to a process gas containing oxygen radicals formed by non-ionizing electromagnetic (EM) radiation induced dissociation of an oxygen-containing gas or an oxygen- and nitrogen-containing gas; and
   heat-treating the oxygen-embedded silicon nitride film to form a stressed silicon oxynitride film.

2. The method of claim 1, wherein the non-ionizing electromagnetic radiation comprises ultraviolet (UV) radiation.

3. The method of claim 1, wherein the integrated circuit structure comprises:
   a high-k film formed on the substrate; and
   a gate electrode film formed on the high-k film.

4. The method of claim 1, wherein the oxygen radicals are formed by ultraviolet radiation induced dissociation of the oxygen gas in the process gas in a processing space above the substrate.

5. The method of claim 1, further comprising:
   flowing the process gas over the substrate substantially parallel to the substrate surface.

6. The method of claim 1, wherein the embedding further comprises a substrate temperature between about 200° C. and about 800° C. and a process gas pressure between about 10 mTorr and about 20 Torr.

7. The method of claim 2, wherein the ultraviolet radiation in the ultraviolet radiation induced dissociation comprises radiation between 145 nm and 192 nm originating from an ultraviolet radiation source operating at an electrical power between about 5 mW/cm$^2$ and about 50 mW/cm$^2$.

8. The method of claim 2, wherein the ultraviolet radiation in the ultraviolet radiation induced dissociation originates from two or more ultraviolet radiation sources.

9. The method of claim 1, wherein the heat-treating comprises heating the substrate to a temperature between about 500° C. and about 1100° C.

10. The method of claim 8, wherein the heat-treating further comprises exposing the substrate to a gas containing O$_2$, N$_2$, H$_2$, Ar, He, Ne, Xe, or Kr, or a combination of two or more thereof.

11. The method of claim 1, wherein the oxygen-containing gas comprises O$_2$, H$_2$O, or H$_2$O$_2$, or a combination thereof, and the oxygen- and nitrogen-containing gas comprises NO, N$_2$O, or NO$_2$, or a combination thereof.

12. The method of claim 1, wherein the depositing comprises exposing the substrate to a deposition gas containing silane, disilane, monochlorosilane, dichlorosilane, trichlorosilane, hexachlorodisilane, tetrakis(dimethylamino)silane, tris(dimethylamino)silane, diethylsilane, tetrakis(ethylmethylamino)silane, bis(diethylamino)silane, bis(di-isopropylamino)silane, tris(isopropylamino)silane, (di-isopropylamino)silane, or bis(tertiarybutylamino)silane, and a nitrogen-containing gas comprising N$_2$, NH$_3$, N$_2$H$_4$, or a C$_1$-C$_{10}$ alkylhydrazine compound.

13. The method of claim 1, further comprising:
repeating the depositing and embedding prior to performing the heat-treating.

14. The method of claim 1, wherein the embedding and heat-treating have at least partial temporal overlap.

15. The method of claim 1, wherein the embedding and heat-treating are performed in the same processing system.

16. The method of claim 1, wherein the embedding and heat-treating are performed in different processing systems.

17. The method of claim 1, wherein a thickness of the silicon nitride film is between about 5 nm and about 50 nm and a thickness of a surface layer containing the embedded oxygen is between about 3 nm and about 10 nm.

18. The method of claim 1, further comprising:
exposing the silicon nitride film to oxygen radicals formed by remote plasma induced dissociation of a second process gas comprising oxygen ($O_2$), and wherein the remote plasma induced dissociation comprises using plasma generated via the coupling of radio frequency (RF) power to the second process gas.

19. The method of claim 18, wherein the exposing the silicon nitride film to oxygen radicals formed by remote plasma induced dissociation of an upstream process gas and the embedding have at least partial temporal overlap.

20. The method of claim 18, wherein the exposing the silicon nitride film to oxygen radicals formed by an upstream plasma induced dissociation of an upstream process gas is performed before or after the embedding.

21. A method of forming a semiconductor device, comprising:
depositing a silicon nitride film over an integrated circuit structure on a substrate, the integrated circuit structure containing a high-k film formed on the substrate and a gate electrode film formed on the high-k film;
embedding oxygen into a surface of the silicon nitride film by exposing the silicon nitride film to a process gas containing oxygen radicals formed by ultraviolet (UV) radiation induced dissociation of an oxygen-containing gas or an oxygen- and nitrogen-containing gas in a processing space above the substrate, wherein the oxygen-containing gas comprises $O_2$, $H_2O$, or $H_2O_2$, or a combination thereof, and the oxygen- and nitrogen-containing gas comprises NO, $N_2O$, or $NO_2$, or a combination thereof; and
heat-treating, the oxygen-embedded silicon nitride film to form a stressed silicon oxynitride film.

* * * * *